(12) United States Patent
Chen et al.

(10) Patent No.: US 10,083,757 B2
(45) Date of Patent: Sep. 25, 2018

(54) SINGLE POLY NONVOLATILE MEMORY DEVICE

(71) Applicant: eMemory Technology Inc., Hsin-Chu (TW)

(72) Inventors: Kuan-Hsun Chen, Tainan (TW); Ming-Shan Lo, Hsinchu (TW); Ting-Ting Su, Taipei (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/293,299

(22) Filed: Oct. 14, 2016

(65) Prior Publication Data

US 2017/0110467 A1    Apr. 20, 2017

Related U.S. Application Data

(60) Provisional application No. 62/242,310, filed on Oct. 16, 2015.

(51) Int. Cl.
| | |
|---|---|
| H01L 27/115 | (2017.01) |
| G11C 16/14 | (2006.01) |
| H01L 29/423 | (2006.01) |
| H01L 29/45 | (2006.01) |
| H01L 29/78 | (2006.01) |
| H01L 29/788 | (2006.01) |
| G11C 16/04 | (2006.01) |
| G11C 16/10 | (2006.01) |

(52) U.S. Cl.
CPC .......... *G11C 16/14* (2013.01); *G11C 16/0433* (2013.01); *G11C 16/10* (2013.01); *H01L 29/42328* (2013.01); *H01L 29/452* (2013.01); *H01L 29/7834* (2013.01); *H01L 29/7881* (2013.01); *H01L 29/7885* (2013.01)

(58) Field of Classification Search
CPC ......... H01L 27/11524; H01L 27/11529; H01L 27/1157
See application file for complete search history.

(56) References Cited

U.S. PATENT DOCUMENTS

| | | |
|---|---|---|
| 5,777,361 A | 7/1998 | Parris |
| 7,074,674 B1 | 7/2006 | Chang |
| 2007/0108470 A1 | 5/2007 | Wang |

(Continued)

FOREIGN PATENT DOCUMENTS

| | | |
|---|---|---|
| JP | 2007142398 A | 6/2007 |
| JP | 2008-71454 A | 3/2008 |

(Continued)

*Primary Examiner* — Cuong Q Nguyen
(74) *Attorney, Agent, or Firm* — Winston Hsu

(57) ABSTRACT

A single-poly NVM cell includes a select transistor and a floating gate transistor serially connected to the select transistor. The select transistor includes a select gate, a select gate oxide layer, a source doping region, a first LDD region merged with the source doping region, a commonly-shared doping region, and a second LDD region merged with the commonly-shared doping region. The floating gate transistor includes a floating gate, a floating gate oxide layer, the commonly-shared doping region, a third LDD region merged with the commonly-shared doping region, and a drain doping region. A drain-side extension modified region is disposed under the spacer and in proximity to the drain doping region.

17 Claims, 3 Drawing Sheets

(56) References Cited

U.S. PATENT DOCUMENTS

| | | |
|---|---|---|
| 2009/0159967 A1 | 6/2009 | Edwards |
| 2011/0044112 A1 | 2/2011 | Torii |
| 2015/0034909 A1 | 2/2015 | Horch |
| 2015/0091073 A1* | 4/2015 | Li .................... H01L 27/11558 |
| | | 257/316 |
| 2015/0187782 A1 | 7/2015 | Yamakoshi |
| 2016/0232977 A1 | 8/2016 | Yamakoshi |

FOREIGN PATENT DOCUMENTS

| | | |
|---|---|---|
| JP | 2015128083 A | 7/2015 |
| JP | 2015211138 A | 11/2015 |
| JP | 2016143856 A | 8/2016 |
| JP | 2016532292 A | 10/2016 |
| TW | 201513269 A | 4/2015 |

* cited by examiner

SINGLE POLY NONVOLATILE MEMORY DEVICE

CROSS REFERENCE TO RELATED APPLICATIONS

This application claims priority from U.S. provisional application No. 62/242,310 filed Oct. 16, 2015, which is incorporated herein by reference in its entirety.

BACKGROUND OF THE INVENTION

1. Field of the Invention

The present invention relates generally to the field of nonvolatile memory devices. More particularly, the present invention relates to a single-poly nonvolatile memory cell structure with improved program performance.

2. Description of the Prior Art

Semiconductor memory devices have become more popular for use in various electronic devices. For example, non-volatile memory (NVM) is widely used in cellular telephones, digital cameras, personal digital assistants, mobile computing devices, and other devices.

Generally, NVM may be divided into multi-time programmable (MTP) memory and one-time programmable (OTP) memory. MTP memory is multi-readable and multi-writable. For example, EEPROM and flash memory are designedly equipped with some corresponding electric circuits to support different operations such as programming, erasing and reading. OTP functions perfectly with electric circuits with mere programming and reading functions. Electric circuits for erasing operation are not required in OTP.

Single-poly NVM designs have been proposed which reduce the additional processing cost. A single-poly NVM forms the charge-storage floating gate with a single layer of polysilicon. Because the single-poly NVM is compatible with regular CMOS process, it is applied in the field of embedded memory, embedded nonvolatile memory in the mixed-mode circuits and micro-controllers (such as System on Chip, SOC), for example.

U.S. Pat. No. 6,678,190 discloses a single-poly NVM having two serially connected PMOS transistors wherein the control gate is omitted in the structure for layout as the bias is not necessary to apply to the floating gate during the programming mode. A first PMOS transistor acts as a select transistor. A second PMOS transistor is connected to the first PMOS transistor. A gate of the second PMOS transistor serves as a floating gate. The floating gate is selectively programmed or erased to store predetermined charges.

It is always desired to provide an NVM structure with features of low voltage operation and low power consumption during programming, as well as high program performance.

SUMMARY OF THE INVENTION

It is one object of the invention to provide an improved single-poly nonvolatile memory cell structure with enhanced program efficiency.

According to the first embodiment, a single-poly nonvolatile memory (NVM) cell includes a semiconductor substrate, an ion well in the semiconductor substrate, a select transistor on the ion well, and a floating gate transistor serially connected to the select transistor. A silicide block (SAB) layer covers the floating gate. A contact etch stop layer is disposed on the SAB layer. An inter-layer dielectric (ILD) layer is deposited on the contact etch stop layer.

The select transistor comprises a select gate, a select gate oxide layer between the select gate and the semiconductor substrate, a source doping region in the ion well, a first lightly doped drain (LDD) region merged with the source doping region, a commonly-shared doping region spaced apart from the source doping region, and a second LDD region merged with the commonly-shared doping region.

The floating gate transistor comprises a floating gate, a floating gate oxide layer between the floating gate and the semiconductor substrate, the commonly-shared doping region, a third LDD region merged with the commonly-shared doping region, and a drain doping region spaced apart from the commonly-shared doping region. No LDD region is merged with the drain doping region.

A first sidewall spacer is provided on either sidewall of the select gate, and a second sidewall spacer is provided on either sidewall of the floating gate. A first salicide layer is disposed on the source doping region. The first salicide layer extends to an edge of a bottom of the sidewall spacer.

A second salicide layer is disposed on the commonly shared doping region. The second salicide layer is contiguous with an edge of a bottom of the first sidewall spacer, but is kept a predetermined distance from an edge of a bottom of the second sidewall spacer.

A third salicide layer is disposed on the drain doping region. The third salicide layer is kept a predetermined distance from an edge of a bottom of the second sidewall spacer.

According to the second embodiment, a single-poly NVM cell includes a semiconductor substrate, an ion well in the semiconductor substrate, a select transistor on the ion well, and a floating gate transistor serially connected to the select transistor. A SAB layer covers the floating gate. A contact etch stop layer is disposed on the SAB layer. An ILD layer is deposited on the contact etch stop layer.

The select transistor comprises a select gate, a select gate oxide layer between the select gate and the semiconductor substrate, a source doping region in the ion well, a first LDD region merged with the source doping region, a commonly-shared doping region spaced apart from the source doping region, and a second LDD region merged with the commonly-shared doping region.

The floating gate transistor comprises a floating gate, a floating gate oxide layer between the floating gate and the semiconductor substrate, the commonly-shared doping region, and a drain doping region spaced apart from the commonly-shared doping region. No LDD region is merged with the drain doping region.

A first sidewall spacer is provided on either sidewall of the select gate, and a second sidewall spacer is provided on either sidewall of the floating gate. No LDD region is merged with the commonly-shared doping region directly under the second sidewall spacer.

According to the third embodiment, a single-poly NVM cell includes a semiconductor substrate, an ion well in the semiconductor substrate, a select transistor on the ion well, and a floating gate transistor serially connected to the select transistor. A SAB layer covers the floating gate. A contact etch stop layer is disposed on the SAB layer. An ILD layer is deposited on the contact etch stop layer.

The select transistor comprises a select gate, a select gate oxide layer between the select gate and the semiconductor substrate, a source doping region in the ion well, a first LDD region merged with the source doping region, a commonly-shared doping region spaced apart from the source doping region, and a second LDD region merged with the commonly-shared doping region.

The floating gate transistor comprises a floating gate, a floating gate oxide layer between the floating gate and the semiconductor substrate, the commonly-shared doping region, a third PLDD region merged with the commonly-shared doping region, a drain doping region spaced apart from the commonly-shared doping region, and an N-type LDD (NLDD) region merged with the drain doping region.

According to the fourth embodiment, a single-poly NVM cell includes a semiconductor substrate, an ion well in the semiconductor substrate, a select transistor on the ion well, and a floating gate transistor serially connected to the select transistor. A SAB layer covers the floating gate. A contact etch stop layer is disposed on the SAB layer. An ILD layer is deposited on the contact etch stop layer.

The select transistor comprises a select gate, a select gate oxide layer between the select gate and the semiconductor substrate, a source doping region in the ion well, a first LDD region merged with the source doping region, a commonly-shared doping region spaced apart from the source doping region, and a second LDD region merged with the commonly-shared doping region.

The floating gate transistor comprises a floating gate, a floating gate oxide layer between the floating gate and the semiconductor substrate, the commonly-shared doping region, a third PLDD region merged with the commonly-shared doping region, a drain doping region spaced apart from the commonly-shared doping region, and a P⁻LDD region merged with the drain doping region. The P⁻LDD region has a doping concentration that is lower than that of the third PLDD region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
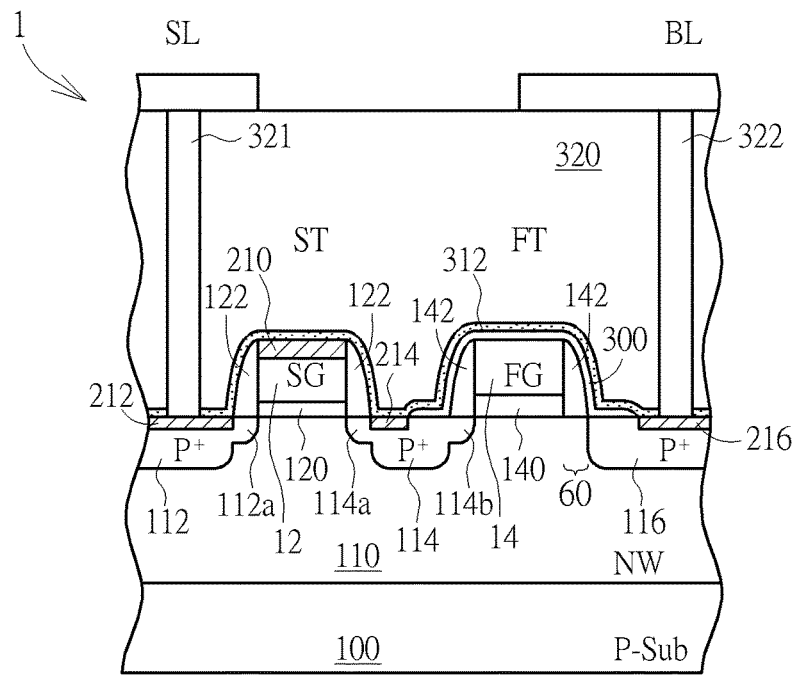
FIG. 1 is a schematic, cross-sectional diagram showing a unit cell of a single-poly nonvolatile memory device according to the first embodiment of the invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art. Other embodiments may be utilized and structural, logical, and electrical changes may be made without departing from the scope of the present invention.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

Please refer to FIG. 1. FIG. 1 is a schematic, cross-sectional diagram showing a unit cell of a single-poly nonvolatile memory device according to the first embodiment of the invention.

As shown in FIG. 1, the unit cell 1 comprises a select transistor ST and a floating gate transistor FT that is series connected to the select transistor ST. According to the first embodiment of the invention, the select transistor ST and the floating gate transistor FT may be disposed on a semiconductor substrate 100 such as a P type silicon substrate. An N well (NW) 110 may be formed in the semiconductor substrate 100. According to the first embodiment of the invention, the select transistor ST and the floating gate transistor FT may be PMOS transistors.

The select transistor ST comprises a select gate (SG) 12, a select gate oxide layer 120 between the select gate (SG) 12 and the semiconductor substrate 100, a sidewall spacer 122 provided on each sidewall of the select gate (SG) 12, a P⁺ source doping region 112 in the N well (NW) 110, a P-type lightly doped drain (PLDD) region 112a merged with the P⁺ source doping region 112, a P⁺ doping region 114 spaced apart from the P⁺ source doping region 112, and a PLDD region 114a merged with the P⁺ doping region 114. In operation, a P-type channel may be formed between the PLDD region 112a and the PLDD region 114a underneath the select gate (SG) 12.

The floating gate transistor FT comprises a floating gate (FG) 14, a floating gate oxide layer 140 between the floating gate (FG) 14 and the semiconductor substrate 100, a sidewall spacer 142 on either sidewall of the floating gate (FG) 14, the P⁺ doping region 114, a PLDD region 114b merged with the P⁺ doping region 114, and a P⁺ drain doping region 116 spaced apart from the P⁺ doping region 114. The P⁺ doping region 114 is commonly shared by the select transistor ST and the floating gate transistor FT. According to the first embodiment, the select gate (SG) 12 and the floating gate (FG) 14 are made of single-layer polysilicon, which is fully compatible with logic processes.

According to the first embodiment of the invention, a drain-side extension modified region 60 is disposed directly under the sidewall spacer 142 on the drain side of the unit cell 1. The drain-side extension modified region 60 is in close proximity to the P⁺ drain doping region 116. No PLDD region is merged with the P⁺ drain doping region 116, thereby forming an asymmetric LDD configuration between the P+ doping region 114 and the P+ drain doping region 116. The doping concentration of the drain-side extension modified region 60 is the same as that of the N well (NW) 110.

By providing such configuration, more electron and hole pairs can be induced during programming operation. More electrons can be injected into the floating gate (FG) 14 during programming operation. Alternatively, the program voltages of the unit cell 1 may be reduced to avoid breakdown issue, particularly for those memory cells with physical gate oxide thickness greater than 160 angstroms (Gox>160 Å).

A self-aligned silicide (salicide) layer 212 is provided on the P+ source doping region 112. The salicide layer 212 may extend to the edge of the bottom of the sidewall spacer 122. On the opposite side of the select gate (SG) 12, a salicide layer 214 is provided on the P+ doping region 114. The salicide layer 214 is contiguous with the edge of the bottom of the sidewall spacer 122, but is kept a predetermined distance from the edge of the bottom of the sidewall spacer 142. In other words, the salicide layer 212 may cover the entire surface area of the P+ source doping region 112, while the salicide layer 214 may only partially cover the surface area of the P+ doping region 114. According to the first embodiment of the invention, the salicide layer 214 is spaced apart from the edge of the spacer 142.

Likewise, on the opposite side of the floating gate (FG) 14, a salicide layer 216 is provided on the P+ drain doping region 116. The salicide layer 216 is kept a predetermined distance from the edge of the bottom of the spacer 142. According to the first embodiment of the invention, a salicide layer 210 may be provided on the top surface of the select gate (SG) 12.

It is noteworthy that no silicide layer is formed on the top surface of the floating gate (FG) 14. A salicide block (SAB) layer 300 may be provided to cover the floating gate (FG) 14. According to the first embodiment, the SAB layer 300 may comprise silicon oxide, but not limited thereto.

According to the first embodiment of the invention, the SAB layer 300 covers the top surface of the floating gate (FG) 14, the surfaces of the spacers 142, a portion of the surface of the P+ doping region 114, and a portion of the P+ drain doping region 116. The aforesaid salicide layers 214 and 216 are formed only on the surface area of the regions 114 and 116 not covered by the SAB layer 300.

Figure 5:
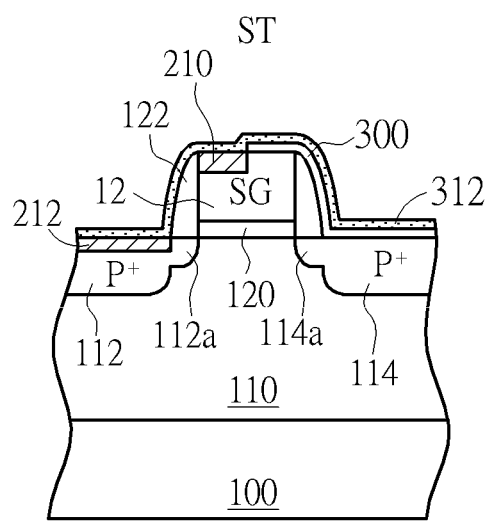
FIG. 5 is a schematic, cross-sectional diagram showing that the silicide block (SAB) layer extends to a top surface of the select gate according to other embodiments.

In another embodiment, as shown in FIG. 5, the SAB layer 300 may extend to a top surface of the select gate 12 and may partially cover the top surface of the select gate 12.

It is believed that the non-salicided region in the P+ doping region 114 between the spacer 142 and the salicide layer 214, and the non-salicided region in the P+ drain doping region 116 between the spacer 142 and the salicide layer 216 can reduce defect induced BTB (band-to-band) tunneling disturbance.

In some cases, it is understood that the entire P+ doping region 114 may be covered with the SAB layer 300, and therefore no silicide is formed on the P+ doping region 114.

Optionally, a conformal contact etch stop layer (CESL) 312 may be deposited over the SAB layer 300 to cover the select gate (SG) 12, the floating gate (FG) 14, the salicide layers 212, 214, and 216. According to the first embodiment, the conformal CESL 312 may be a silicon nitride layer and may be deposited by using a chemical vapor deposition process.

The silicon to nitride ratio in the conformal CESL 312 may be adjusted (e.g. by tuning the $SiH_4/NH_3$ ratio in the reaction chamber) to reduce the electron trapping ability thereof. It is noteworthy that CESL 312 is not in direct contact with the floating gate (FG) 14 or the spacer 142 because of the SAB layer 300. By isolating the floating gate (FG) 14 from CESL 312 with the SAB layer 300, the data retention characteristic of the single-poly NVM is improved.

An inter-layer dielectric (ILD) layer 320 may be deposited on CESL 312. The ILD layer 320 is thicker than CESL 312 and is deposited to completely fill the space between the select gate (SG) 12 and the floating gate (FG) 14. A chemical mechanical polishing (CMP) process may be carried out, if necessary, to planarize the top surface of the ILD layer 320. A source line contact 321 and a bit line contact 322 are formed in the ILD layer 320. A source line (SL) and a bit line (BL) may be defined in the first metal layer to respectfully connect to the source line contact 321 and the bit line contact 322.

Figure 2:
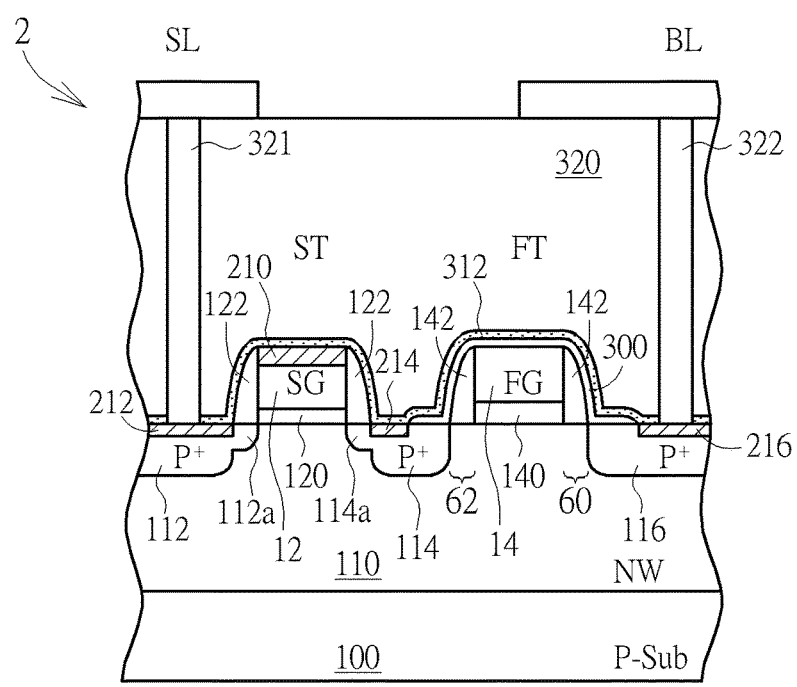
FIG. 2 is a schematic, cross-sectional diagram showing a unit cell of a single-poly nonvolatile memory device according to the second embodiment of the invention.

Please refer to FIG. 2. FIG. 2 is a schematic, cross-sectional diagram showing a unit cell of a single-poly nonvolatile memory device according to the second embodiment of the invention.

As shown in FIG. 2, likewise, the unit cell 2 comprises a select transistor ST and a floating gate transistor FT that is series connected to the select transistor ST. According to the second embodiment of the invention, the select transistor ST and the floating gate transistor FT may be disposed on a semiconductor substrate 100 such as a P type silicon substrate. An N well (NW) 110 may be formed in the semiconductor substrate 100.

The select transistor ST comprises a select gate (SG) 12, a select gate oxide layer 120 between the select gate (SG) 12 and the semiconductor substrate 100, a sidewall spacer 122 provided on either sidewall of the select gate (SG) 12, a P+ source doping region 112 in the N well (NW) 110, a P-type lightly doped drain (PLDD) region 112a merged with the P+ source doping region 112, a P+ doping region 114 spaced apart from the P+ source doping region 112, and a PLDD region 114a merged with the P+ doping region 114. In operation, a P-type channel may be formed between the PLDD region 112a and the PLDD region 114a underneath the select gate (SG) 12.

The floating gate transistor FT comprises a floating gate (FG) 14, a floating gate oxide layer 140 between the floating gate (FG) 14 and the semiconductor substrate 100, a sidewall spacer 142 on either sidewall of the floating gate (FG) 14, the P+ doping region 114, and a P+ drain doping region 116 spaced apart from the P+ doping region 114. The P+ doping region 114 is commonly shared by the select transistor ST and the floating gate transistor FT. According to the second embodiment, the select gate (SG) 12 and the floating gate (FG) 14 are made of single-layer polysilicon, which is fully compatible with logic processes.

According to the second embodiment of the invention, a drain-side extension modified region 60 is disposed directly under the sidewall spacer 142 on the drain side of the unit cell 2. The drain-side extension modified region 60 is in close proximity to the P+ drain doping region 116. An extension modified region 62 is disposed directly under the sidewall spacer 142. The extension modified region 62 is in close proximity to the P+ doping region 114. No PLDD region is merged with the P+ drain doping region 116, and no PLDD region is merged with the P+ doping region 114 under the spacer 142, thereby forming a non-LDD configuration between the P+ doping region 114 and the P+ drain doping region 116.

A self-aligned silicide (salicide) layer 212 is provided on the P+ source doping region 112. The salicide layer 212 may extend to the edge of the bottom of the sidewall spacer 122.

On the opposite side of the select gate (SG) 12, a salicide layer 214 is provided on the P+ doping region 114. The salicide layer 214 is contiguous with the edge of the bottom of the sidewall spacer 122, but is kept a predetermined distance from the edge of the bottom of the sidewall spacer 142. In other words, the salicide layer 212 may cover the entire surface area of the P+ source doping region 112, while the salicide layer 214 may only partially cover the surface area of the P+ doping region 114. According to the second embodiment of the invention, the salicide layer 214 is spaced apart from the edge of the spacer 142.

Likewise, on the opposite side of the floating gate (FG) 14, a salicide layer 216 is provided on the P+ drain doping region 116. The salicide layer 216 is kept a predetermined distance from the edge of the bottom of the spacer 142. According to the second embodiment of the invention, a salicide layer 210 may be provided on the top surface of the select gate (SG) 12.

It is noteworthy that no silicide layer is formed on the top surface of the floating gate (FG) 14. A salicide block (SAB) layer 300 may be provided to cover the floating gate (FG) 14. According to the second embodiment, the SAB layer 300 may comprise silicon oxide, but not limited thereto.

According to the second embodiment of the invention, the SAB layer 300 covers the top surface of the floating gate (FG) 14, the surfaces of the spacers 142, a portion of the surface of the P+ doping region 114, and a portion of the P+ drain doping region 116. The aforesaid salicide layers 214 and 216 are formed only on the surface area of the regions 114 and 116 not covered by the SAB layer 300. The SAB layer 300 may extend to a top surface of the select gate 12 and may partially cover the top surface of the select gate 12, as depicted in FIG. 5.

Optionally, a conformal contact etch stop layer (CESL) 312 may be deposited over the SAB layer 300 to cover the select gate (SG) 12, the floating gate (FG) 14, the salicide layers 212, 214, and 216. According to the second embodiment, the conformal CESL 312 may be a silicon nitride layer and may be deposited by using a chemical vapor deposition process.

The silicon to nitride ratio in the conformal CESL 312 may be adjusted (e.g. by tuning the $SiH_4/NH_3$ ratio in the reaction chamber) to reduce the electron trapping ability thereof. It is noteworthy that CESL 312 is not in direct contact with the floating gate (FG) 14 or the spacer 142 because of the SAB layer 300. By isolating the floating gate (FG) 14 from CESL 312 with the SAB layer 300, the data retention characteristic of the single-poly NVM is improved.

An inter-layer dielectric (ILD) layer 320 may be deposited on CESL 312. The ILD layer 320 is thicker than CESL 312 and is deposited to completely fill the space between the select gate (SG) 12 and the floating gate (FG) 14. A chemical mechanical polishing (CMP) process may be carried out, if necessary, to planarize the top surface of the ILD layer 320. A source line contact 321 and a bit line contact 322 are formed in the ILD layer 320. A source line (SL) and a bit line (BL) may be defined in the first metal layer to respectfully connect to the source line contact 321 and the bit line contact 322.

Figure 3:
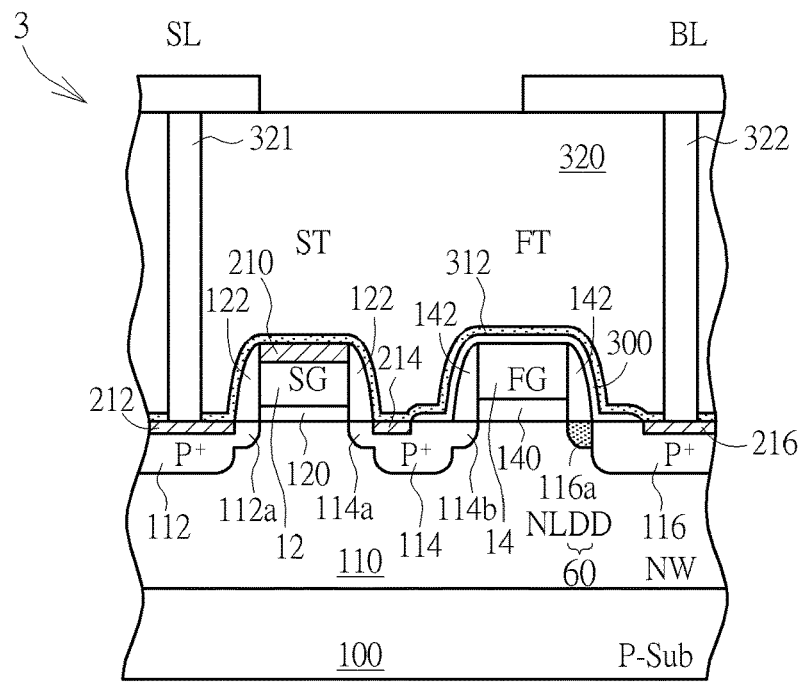
FIG. 3 is a schematic, cross-sectional diagram showing a unit cell of a single-poly nonvolatile memory device according to the third embodiment of the invention.

Please refer to FIG. 3. FIG. 3 is a schematic, cross-sectional diagram showing a unit cell of a single-poly nonvolatile memory device according to the third embodiment of the invention.

As shown in FIG. 3, likewise, the unit cell 3 comprises a select transistor ST and a floating gate transistor FT that is series connected to the select transistor ST. According to the third embodiment of the invention, the select transistor ST and the floating gate transistor FT may be disposed on a semiconductor substrate 100 such as a P type silicon substrate. An N well (NW) 110 may be formed in the semiconductor substrate 100.

The select transistor ST comprises a select gate (SG) 12, a select gate oxide layer 120 between the select gate (SG) 12 and the semiconductor substrate 100, a sidewall spacer 122 provided on either sidewall of the select gate (SG) 12, a P+ source doping region 112 in the N well (NW) 110, a P-type lightly doped drain (PLDD) region 112a merged with the P+ source doping region 112, a P+ doping region 114 spaced apart from the P+ source doping region 112, and a PLDD region 114a merged with the P+ doping region 114. In operation, a P-type channel may be formed between the PLDD region 112a and the PLDD region 114a underneath the select gate (SG) 12.

The floating gate transistor FT comprises a floating gate (FG) 14, a floating gate oxide layer 140 between the floating gate (FG) 14 and the semiconductor substrate 100, a sidewall spacer 142 on either sidewall of the floating gate (FG) 14, the P+ doping region 114, a PLDD region 114b merged with the P+ doping region 114, and a P+ drain doping region 116 spaced apart from the P+ doping region 114. A drain-side extension modified region 60 is disposed directly under the sidewall spacer 142 on the drain side of the unit cell 3. The drain-side extension modified region 60 is in close proximity to the P+ drain doping region 116. According to the third embodiment of the invention, the drain-side extension modified region 60 has a conductivity type that is different from that of the P+ drain doping region 116.

According to the third embodiment of the invention, an N-type lightly doped drain (NLDD) region 116a is formed within the drain-side extension modified region 60, The N-type lightly doped drain (NLDD) region 116a is merged with the P+ drain doping region 116 directly under the spacer 142. The P+ doping region 114 is commonly shared by the select transistor ST and the floating gate transistor FT. According to the third embodiment, the select gate (SG) 12 and the floating gate (FG) 14 are made of single-layer polysilicon, which is fully compatible with logic processes.

A self-aligned silicide (salicide) layer 212 is provided on the P+ source doping region 112. The salicide layer 212 may extend to the edge of the bottom of the sidewall spacer 122. On the opposite side of the select gate (SG) 12, a salicide layer 214 is provided on the P+ doping region 114. The salicide layer 214 is contiguous with the edge of the bottom of the sidewall spacer 122, but is kept a predetermined distance from the edge of the bottom of the sidewall spacer 142. In other words, the salicide layer 212 may cover the entire surface area of the P+ source doping region 112, while the salicide layer 214 may only partially cover the surface area of the P+ doping region 114. According to the third embodiment of the invention, the salicide layer 214 is spaced apart from the edge of the spacer 142.

Likewise, on the opposite side of the floating gate (FG) 14, a salicide layer 216 is provided on the P+ drain doping region 116. The salicide layer 216 is kept a predetermined distance from the edge of the bottom of the spacer 142. According to the third embodiment of the invention, a salicide layer 210 may be provided on the top surface of the select gate (SG) 12.

It is noteworthy that no silicide layer is formed on the top surface of the floating gate (FG) 14. A salicide block (SAB) layer 300 may be provided to cover the floating gate (FG) 14. According to the third embodiment, the SAB layer 300 may comprise silicon oxide, but not limited thereto.

According to the third embodiment of the invention, the SAB layer 300 covers the top surface of the floating gate (FG) 14, the surfaces of the spacers 142, a portion of the surface of the P+ doping region 114, and a portion of the P+ drain doping region 116. The SAB layer 300 may extend to a top surface of the select gate 12 and may partially cover the top surface of the select gate 12, as depicted in FIG. 5. The aforesaid salicide layers 214 and 216 are formed only on the surface area of the regions 114 and 116 not covered by the SAB layer 300.

Optionally, a conformal contact etch stop layer (CESL) 312 may be deposited over the SAB layer 300 to cover the select gate (SG) 12, the floating gate (FG) 14, the salicide layers 212, 214, and 216. According to the third embodiment, the conformal CESL 312 may be a silicon nitride layer and may be deposited by using a chemical vapor deposition process.

The silicon to nitride ratio in the conformal CESL 312 may be adjusted (e.g. by tuning the $SiH_4/NH_3$ ratio in the reaction chamber) to reduce the electron trapping ability thereof. It is noteworthy that CESL 312 is not in direct contact with the floating gate (FG) 14 or the spacer 142 because of the SAB layer 300. By isolating the floating gate (FG) 14 from CESL 312 with the SAB layer 300, the data retention characteristic of the single-poly NVM is improved.

An inter-layer dielectric (ILD) layer 320 may be deposited on CESL 312. The ILD layer 320 is thicker than CESL 312 and is deposited to completely fill the space between the select gate (SG) 12 and the floating gate (FG) 14. A chemical mechanical polishing (CMP) process may be carried out, if necessary, to planarize the top surface of the ILD layer 320. A source line contact 321 and a bit line contact 322 are formed in the ILD layer 320. A source line (SL) and a bit line (BL) may be defined in the third metal layer to respectfully connect to the source line contact 321 and the bit line contact 322.

Figure 4:
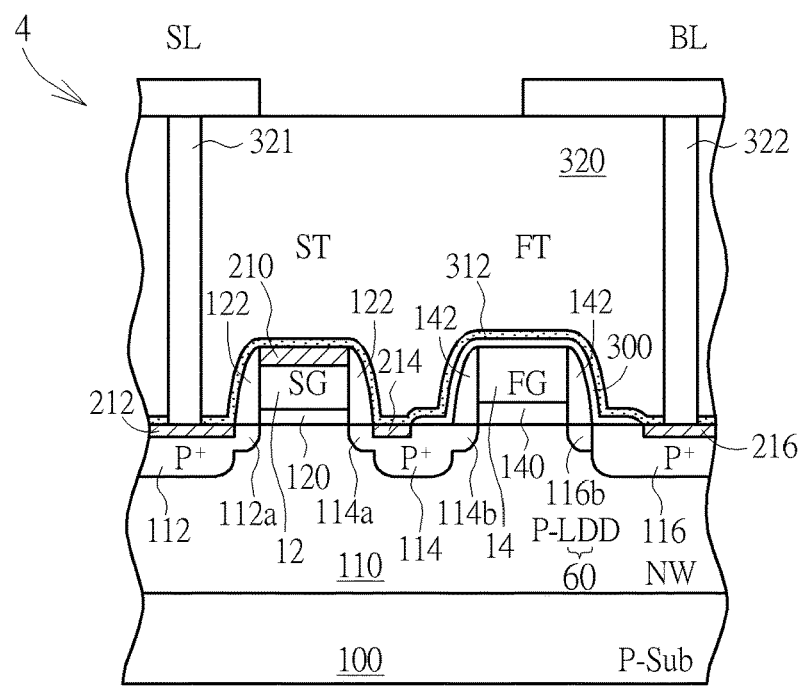
FIG. 4 is a schematic, cross-sectional diagram showing a unit cell of a single-poly nonvolatile memory device according to the fourth embodiment of the invention.

Please refer to FIG. 4. FIG. 4 is a schematic, cross-sectional diagram showing a unit cell of a single-poly nonvolatile memory device according to the fourth embodiment of the invention.

As shown in FIG. 4, likewise, the unit cell 4 comprises a select transistor ST and a floating gate transistor FT that is series connected to the select transistor ST. According to the fourth embodiment of the invention, the select transistor ST and the floating gate transistor FT may be disposed on a semiconductor substrate 100 such as a P type silicon substrate. An N well (NW) 110 may be formed in the semiconductor substrate 100.

The select transistor ST comprises a select gate (SG) 12, a select gate oxide layer 120 between the select gate (SG) 12 and the semiconductor substrate 100, a sidewall spacer 122 provided on either sidewall of the select gate (SG) 12, a P+ source doping region 112 in the N well (NW) 110, a P-type lightly doped drain (PLDD) region 112a merged with the P+ source doping region 112, a P+ doping region 114 spaced apart from the P+ source doping region 112, and a PLDD region 114a merged with the P+ doping region 114. In operation, a P-type channel may be formed between the PLDD region 112a and the PLDD region 114a underneath the select gate (SG) 12.

The floating gate transistor FT comprises a floating gate (FG) 14, a floating gate oxide layer 140 between the floating gate (FG) 14 and the semiconductor substrate 100, a sidewall spacer 142 on either sidewall of the floating gate (FG) 14, the P+ doping region 114, a PLDD region 114b merged with the P+ doping region 114, and a P+ drain doping region 116 spaced apart from the P+ doping region 114. A drain-side extension modified region 60 is disposed directly under the sidewall spacer 142 on the drain side of the unit cell 4. The drain-side extension modified region 60 is in close proximity to the P+ drain doping region 116.

A P-LDD region 116b is formed within the drain-side extension modified region 60. The P-LDD region 116b merged with the P+ drain doping region 116 directly under the spacer 142. The P-LDD region 116b has a doping concentration that is lower than that of the PLDD region 114b and the P+ drain doping region 116. The P+ doping region 114 is commonly shared by the select transistor ST and the floating gate transistor FT. According to the fourth embodiment, the select gate (SG) 12 and the floating gate (FG) 14 are made of single-layer polysilicon, which is fully compatible with logic processes.

A self-aligned silicide (salicide) layer 212 is provided on the P+ source doping region 112. The salicide layer 212 may extend to the edge of the bottom of the sidewall spacer 122. On the opposite side of the select gate (SG) 12, a salicide layer 214 is provided on the P+ doping region 114. The salicide layer 214 is contiguous with the edge of the bottom of the sidewall spacer 122, but is kept a predetermined distance from the edge of the bottom of the sidewall spacer 142. In other words, the salicide layer 212 may cover the entire surface area of the P+ source doping region 112, while the salicide layer 214 may only partially cover the surface area of the P+ doping region 114. According to the fourth embodiment of the invention, the salicide layer 214 is spaced apart from the edge of the spacer 142.

Likewise, on the opposite side of the floating gate (FG) 14, a salicide layer 216 is provided on the P+ drain doping region 116. The salicide layer 216 is kept a predetermined distance from the edge of the bottom of the spacer 142. According to the fourth embodiment of the invention, a salicide layer 210 may be provided on the top surface of the select gate (SG) 12.

It is noteworthy that no silicide layer is formed on the top surface of the floating gate (FG) 14. A salicide block (SAB) layer 300 may be provided to cover the floating gate (FG) 14. According to the fourth embodiment, the SAB layer 300 may comprise silicon oxide, but not limited thereto.

According to the fourth embodiment of the invention, the SAB layer 300 covers the top surface of the floating gate (FG) 14, the surfaces of the spacers 142, a portion of the surface of the P+ doping region 114, and a portion of the P+ drain doping region 116. The SAB layer 300 may extend to a top surface of the select gate 12 and may partially cover the top surface of the select gate 12, as depicted in FIG. 5. The aforesaid salicide layers 214 and 216 are formed only on the surface area of the regions 114 and 116 not covered by the SAB layer 300.

Optionally, a conformal contact etch stop layer (CESL) 312 may be deposited over the SAB layer 300 to cover the select gate (SG) 12, the floating gate (FG) 14, the salicide layers 212, 214, and 216. According to the fourth embodiment, the conformal CESL 312 may be a silicon nitride layer and may be deposited by using a chemical vapor deposition process.

The silicon to nitride ratio in the conformal CESL 312 may be adjusted (e.g. by tuning the $SiH_4/NH_3$ ratio in the reaction chamber) to reduce the electron trapping ability thereof. It is noteworthy that CESL 312 is not in direct contact with the floating gate (FG) 14 or the spacer 142 because of the SAB layer 300. By isolating the floating gate (FG) 14 from CESL 312 with the SAB layer 300, the data retention characteristic of the single-poly NVM is improved.

An inter-layer dielectric (ILD) layer 320 may be deposited on CESL 312. The ILD layer 320 is thicker than CESL 312 and is deposited to completely fill the space between the select gate (SG) 12 and the floating gate (FG) 14. A chemical mechanical polishing (CMP) process may be carried out, if necessary, to planarize the top surface of the ILD layer 320. A source line contact 321 and a bit line contact 322 are formed in the ILD layer 320. A source line (SL) and a bit line (BL) may be defined in the fourth metal layer to respectfully connect to the source line contact 321 and the bit line contact 322.

It is noted that the PLDD region 114b in the above embodiments can also be replaced by a NLDD region or P-LDD region, or even omitted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single-poly nonvolatile memory (NVM) cell, comprising:
   a semiconductor substrate;
   an ion well in the semiconductor substrate;
   a select transistor on the ion well, wherein the select transistor comprises a select gate, a select gate oxide layer between the select gate and the semiconductor substrate, a source doping region in the ion well, a first lightly doped drain (LDD) region merged with the source doping region, a commonly-shared doping region spaced apart from the source doping region, and a second LDD region merged with the commonly-shared doping region;
   a floating gate transistor serially connected to the select transistor, wherein the floating gate transistor comprises a floating gate, a floating gate oxide layer between the floating gate and the semiconductor substrate, the commonly-shared doping region, a third LDD region merged with the commonly-shared doping region, and a drain doping region spaced apart from the commonly-shared doping region;
   a drain-side extension modified region under the spacer and in proximity to the drain doping region;
   a first salicide layer on the source doping region; and
   a silicide block (SAB) layer covering and being in direct contact with the floating gate.

2. The single-poly NVM cell according to claim 1, wherein a doping concentration of the drain-side extension modified region is the same as that of the ion well.

3. The single-poly NVM cell according to claim 1, wherein the drain-side extension modified region has a conductivity type that is different from that of the drain doping region.

4. The single-poly NVM cell according to claim 1, wherein a doping concentration of the drain-side extension modified region is lower than that of the drain doping region.

5. The single-poly NVM cell according to claim 1 further comprising:
   a contact etch stop layer on the SAB layer, wherein the floating gate is isolated from the contact etch stop layer by the SAB layer.

6. The single-poly NVM cell according to claim 5 further comprising:
   an inter-layer dielectric (ILD) layer on the contact etch stop layer.

7. The single-poly NVM cell according to claim 1 further comprising a first sidewall spacer provided on each sidewall of the select gate, and a second sidewall spacer provided on each sidewall of the floating gate.

8. The single-poly NVM cell according to claim 7, wherein the first salicide layer extends to an edge of a bottom of the first sidewall spacer.

9. The single-poly NVM cell according to claim 8 further comprising a second salicide layer on the commonly shared doping region, wherein the second salicide layer is contiguous with an edge of a bottom of the first sidewall spacer, but is kept a predetermined distance from an edge of a bottom of the second sidewall spacer.

10. The single-poly NVM cell according to claim 9 further comprising a third salicide layer on the drain doping region, wherein the third salicide layer is kept a predetermined distance from an edge of a bottom of the second sidewall spacer.

11. The single-poly NVM cell according to claim 10 further comprising a fourth salicide layer on a top surface of the select gate.

12. The single-poly NVM cell according to claim 1, wherein no silicide layer is formed on a top surface of the floating gate.

13. The single-poly NVM cell according to claim 1, wherein the SAB layer comprises silicon oxide.

14. The single-poly NVM cell according to claim 7, wherein the SAB layer covers and is in direct contact with a top surface of the floating gate, surfaces of the second sidewall spacers, only a portion of the commonly shared doping region, and only a portion of the drain doping region.

15. The single-poly NVM cell according to claim 1, wherein the select transistor and the floating gate transistor are both a PMOS transistor.

16. The single-poly NVM cell according to claim 15, wherein the ion well is an N well, and wherein the source doping region, the commonly shared doping region, and the drain doping region are $P^+$ doping regions.

17. The single-poly NVM cell according to claim 16, wherein the first LDD region, the second LDD region, and the third LDD region are PLDD regions.

* * * * *